United States Patent
Wang et al.

(10) Patent No.: US 9,911,575 B2
(45) Date of Patent: *Mar. 6, 2018

(54) APPARATUS FOR CHARGED PARTICLE LITHOGRAPHY SYSTEM

(71) Applicant: Taiwan Semiconductor Manufacturing Company, Ltd., Hsin-Chu (TW)

(72) Inventors: Shih-Chi Wang, Zhubei (TW); Tsung-Chih Chien, Caotun Township, Nantou County (TW); Hui-Min Huang, Taoyuan (TW); Jaw-Jung Shin, Hsinchu (TW); Shy-Jay Lin, Jhudong Township, Hsinchu County (TW); Burn Jeng Lin, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/207,150

(22) Filed: Jul. 11, 2016

(65) Prior Publication Data
US 2016/0322199 A1  Nov. 3, 2016

Related U.S. Application Data

(63) Continuation of application No. 14/483,740, filed on Sep. 11, 2014, now Pat. No. 9,390,891.

(Continued)

(51) Int. Cl.
*H01J 37/00* (2006.01)
*H01J 37/317* (2006.01)
(Continued)

(52) U.S. Cl.
CPC ........ *H01J 37/3177* (2013.01); *H01J 37/045* (2013.01); *H01J 37/10* (2013.01);
(Continued)

(58) Field of Classification Search
CPC ...... H01J 37/3177; H01J 37/045; H01J 37/10; H01J 37/12; H01J 37/20; H01J 2237/0435; H01J 2237/1205
(Continued)

(56) References Cited

U.S. PATENT DOCUMENTS 6,617,585 B1   9/2003   Stickel
6,768,125 B2   7/2004   Platzgummer et al.
(Continued)

FOREIGN PATENT DOCUMENTS

CN       1580955      2/2005
CN     102067272      5/2011
(Continued)

*Primary Examiner* — Wyatt Stoffa
*Assistant Examiner* — Hanway Chang
(74) *Attorney, Agent, or Firm* — Haynes and Boone, LLP

(57) ABSTRACT

A charged particle multi-beam lithography system includes an illumination sub-system that is configured to generate a charged particle beam; and multiple plates with a first aperture through the plates. The plates and the first aperture are configured to form a charged particle doublet. The system further includes a blanker having a second aperture whose footprint is smaller than that of the first aperture. The charged particle doublet is configured to demagnify a portion of the charged particle beam passing through the first aperture, thereby producing a demagnified beamlet. The blanker is configured to receive the demagnified beamlet from the charged particle doublet, and is further configured to conditionally allow the demagnified beamlet to travel along a desired path.

20 Claims, 5 Drawing Sheets

Related U.S. Application Data

(60) Provisional application No. 62/037,938, filed on Aug. 15, 2014.

(51) Int. Cl.
*H01J 37/10* (2006.01)
*H01J 37/04* (2006.01)
*H01J 37/12* (2006.01)
*H01J 37/20* (2006.01)

(52) U.S. Cl.
CPC ............ *H01J 37/12* (2013.01); *H01J 37/20* (2013.01); *H01J 2237/0435* (2013.01); *H01J 2237/1205* (2013.01)

(58) Field of Classification Search
USPC ............................. 250/396 R, 398, 396 ML
See application file for complete search history.

(56) References Cited

U.S. PATENT DOCUMENTS

| | | |
|---|---|---|
| 7,081,621 B1 | 7/2006 | Willoughby et al. |
| 7,129,502 B2 | 10/2006 | Kruit |
| 7,687,783 B2 | 3/2010 | Platzgummer et al. |
| 8,677,511 B2 | 3/2014 | Wang et al. |
| 9,390,891 B2 | 7/2016 | Wang et al. |
| 2012/0295203 A1 | 11/2012 | Sano |
| 2013/0248731 A1 | 9/2013 | Tanimoto et al. |
| 2014/0175302 A1 | 6/2014 | Touya et al. |
| 2016/0049278 A1 | 2/2016 | Wang et al. |

FOREIGN PATENT DOCUMENTS

| | | |
|---|---|---|
| CN | 102648509 | 8/2012 |
| EP | 1 557 866 B1 | 7/2005 |
| JP | 2006261342 | 9/2006 |
| TW | 201248674 | 12/2012 |

APPARATUS FOR CHARGED PARTICLE LITHOGRAPHY SYSTEM

PRIORITY

This is a continuation of U.S. patent application Ser. No. 14/483,740, entitled "An Apparatus for Charged Particle Lithography System," filed Sep. 11, 2014, which claims the benefit of U.S. Prov. No. 62/037,938 entitled "An Apparatus for Charged Particle Lithography System," filed Aug. 15, 2014. The entirety of both applications is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, charged particle multi-beam (CPMB) lithography systems have great potential for scaling down the feature size in semiconductor manufacturing. In a CPMB lithography system, a single charged particle beam is generated by a charged particle source and then split into multiple beams (or beamlets). The individual beamlets pass through an electro-optical lens system and irradiate a target according to an IC design pattern, thereby transferring the IC design pattern to the target. One challenge in such a system is the low transmission efficiency of the charged particle beam.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
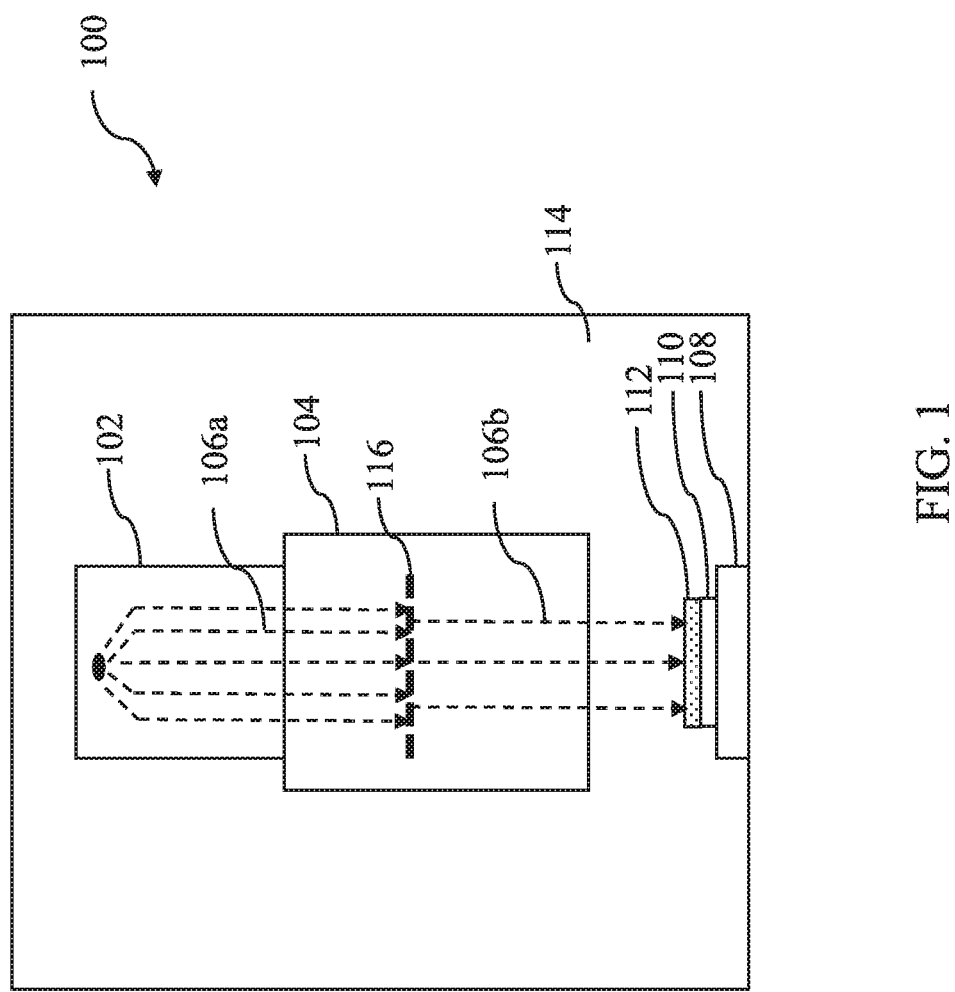
FIG. 1 illustrates a schematic diagram of a CPMB lithography system for implementing one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to charged particle multi-beam (CPMB) lithography systems and more particularly to a pattern definition system in a CPMB lithography system. According to some embodiments of the present disclosure, the pattern definition system includes an array of charged particle blankers, such as charged particle deflectors, and an array of charged particle doublets each associated with one of the blankers. The doublets are arranged in front of the blankers in the direction of an incoming charged particle beam which is wide and substantially telecentric (parallel). Each doublet has a first aperture that allows a portion of the charged particle beam (hereinafter referred to as a beamlet) to pass through. Each doublet is also configured to demagnify the beamlet as it passes through, i.e. condensing it into a narrower yet substantially telecentric beamlet. Each associated blanker has a second aperture that receives the demagnified beamlet and allows it to pass through conditionally, i.e., the blanker can be configured into one of two states, a switched-on state, wherein the demagnified beamlet is allowed to travel along a desired path to reach a target, and a switched-off state, wherein the demagnified beamlet is prevented from traveling along the desired path. By controlling the array of blankers according to an IC design pattern, the pattern definition system can transfer the IC design pattern to the target. In various embodiments, the first aperture of the doublets is greater than the second aperture of the blankers, allowing more charged particles to pass through, thereby increasing the particle beam efficiency of the CPMB lithography system.

FIG. 1 illustrates a CPMB lithography system 100 that can benefit from one or more embodiments of the present disclosure. Referring to FIG. 1, the CPMB lithography system 100 includes an illumination system 102 that is configured to generate a wide, substantially telecentric charged particle beam 106a; an electro-optical column 104 that is configured to conditionally pass portions of the beam 106a as individual beamlets 106b; and a stage 108 that is configured to hold a target. In the embodiment as shown, the target is a substrate 110 (e.g., a wafer) that is coated with a resist film 112. The CPMB system 100 further includes a vacuum chamber 114 that houses the various aforementioned components of the CPMB lithography system 100. In operation, the beamlets 106b irradiate the resist film 112, thereby imaging it with a predefined pattern. The CPMB lithography system 100 as shown in FIG. 1 is merely an example and other configurations and inclusion or omission of devices are possible. Various embodiments of the present disclosure particularly benefit the design and implementation of the electro-optical column 104. However, the various components of the CPMB lithography system 100 are briefly introduced below for understanding the application of various embodiments of the present disclosure.

Still referring to FIG. 1, the illumination system 102 includes a particle source that emits energized particles, such as electrons or ions. For example, electrons can be generated from a conducting material by heating the conducting material to a very high temperature, whereby the electrons have sufficient energy to overcome a work function barrier and escape from the conducting material (thermionic sources). Electrons can also be generated by applying an electric field sufficiently strong such that electrons tunnel through the work function barrier of a conducting material (field emission sources). Alternatively, the particle source may generate positively or negatively charged ions from a gas, such as hydrogen, helium, carbon, nitrogen, oxygen, neon, argon, krypton, and xenon. The energized particles have a kinetic energy of typically few keV, such as 5 to 10 keV. The illumination system 102 further includes an electro-optical condenser lens system that converts the charged particles from a point source to the beam 106a which is a wide and substantially telecentric (i.e., parallel) beam. The beam 106a serves as the lithography beam for the CPMB lithography system 100. The beam 106a irradiates the electro-optical column 104.

The electro-optical column 104, which will be discussed in more details below, includes various first apertures facing the illumination system 102. In embodiments, the first apertures may be square-shaped or round-shaped and are arranged in rows and columns, such as a square grid or a checker board. The first apertures may also be arranged in a honeycomb grid in some embodiments. Portions of the beam 106a go through the first apertures and become individual beamlets 106b. In an embodiment, the electro-optical column 104 further includes a pattern definition system comprising of a plurality of electro-optical paths 116. In various embodiments, the paths 116 each include one or more apertures and/or one or more electro-optical lenses that are axially aligned so as to define a pathway for a beamlet 106b to travel through. In embodiments, the first apertures of the electro-optical column 104 may be combined with or merged into the paths 116. Furthermore, each path 116 is configured to allow a beamlet 106b to pass through conditionally, thereby modulating the beamlets. The modulation is achieved by configuring a path 116 into one of two states: a "switched-on" or "open" state and a "switched-off" or "close" state. When a path 116 is switched on, it allows the associated beamlet 106b to pass through and to irradiate the resist film 112. When a path 116 is switched off, it prevents the associated beamlet 106b from reaching the resist film 112. By modulating the beamlets 106b according to a pattern, such as a layer of an integrated circuit (IC) layout, the electro-optical column 104 can be used to transfer the pattern to the resist film 112. Generally, not every portion of the beam 106a is received by the paths 116. The portion of the beam 106a not received by any of the paths 116 is absorbed in, and discarded by, the CPMB lithography system 100, constituting a waste of resources. Various aspects of the present disclosure are provided for improving the efficiency of the electro-optical column 104 (hence, the efficiency of the CPMB lithography system 100). The electro-optical column 104 may include additional lens systems after the paths 116 to demagnify the beamlets 106b before they reach the resist film 112. In one example, the additional lens systems may have a demagnification factor of about 200 times.

The stage 108 is comprised of a plurality of motors, roller guides, and tables. It secures the substrate 110 thereon and provides accurate position and movement of the substrate 110 in horizontal and vertical directions during the exposure operations. The substrate 110 may be secured by vacuum, e-chuck, or other suitable methods. The CPMB lithography system 100 may further include a transportation unit that loads and unloads the substrate 110. The vacuum chamber 114 provides a high vacuum to ensure unimpeded propagation of the beams 106a and 106b as well as effective exposure of the resist film 112.

The substrate 110 may be a wafer substrate, a mask substrate, or any other suitable substrate. For example, the substrate 110 may include a silicon wafer. Alternatively or additionally, the substrate 110 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. The substrate 110 may include a semiconductor on insulator (SOI), be strained/stressed for performance enhancement, include epitaxial regions, include isolation regions, include doped regions, include one or more semiconductor devices or portions thereof, include conductive and/or non-conductive layers, and/or include other suitable features and layers. In yet another example, the substrate 110 is mask substrate that may include a low thermal expansion material such as quartz, silicon, silicon carbide, or silicon oxide-titanium oxide compound. To further this example, the substrate 110 may be a mask substrate for making a deep ultraviolet (DUV) mask, an extreme ultraviolet (EUV) mask, or other types of masks.

The resist film 112 is formed out of a material sensitive to the charged particle beamlets 106b. In one example, a liquid polymeric material is spin coated onto the substrate 110 and is baked to form the resist film 112. In various examples, the resist film 112 may be a positive tone resist or a negative tone resist. With a positive tone resist, the portions of the resist film 112 irradiated (or exposed) by the beamlets 106b become soluble in a developer and the un-irradiated portions remain insoluble in the developer. A negative tone resist has the opposite behavior. After having been exposed in the CPMB lithography system 100, the resist film 112 is removed to another fabrication unit (not shown) and is subsequently developed to remove the exposed portions (or not exposed portions for negative resist), thereby forming a resist pattern. The substrate 110 is then etched using the resist pattern as an etch mask to form patterns therein or thereon.

Figure 2:
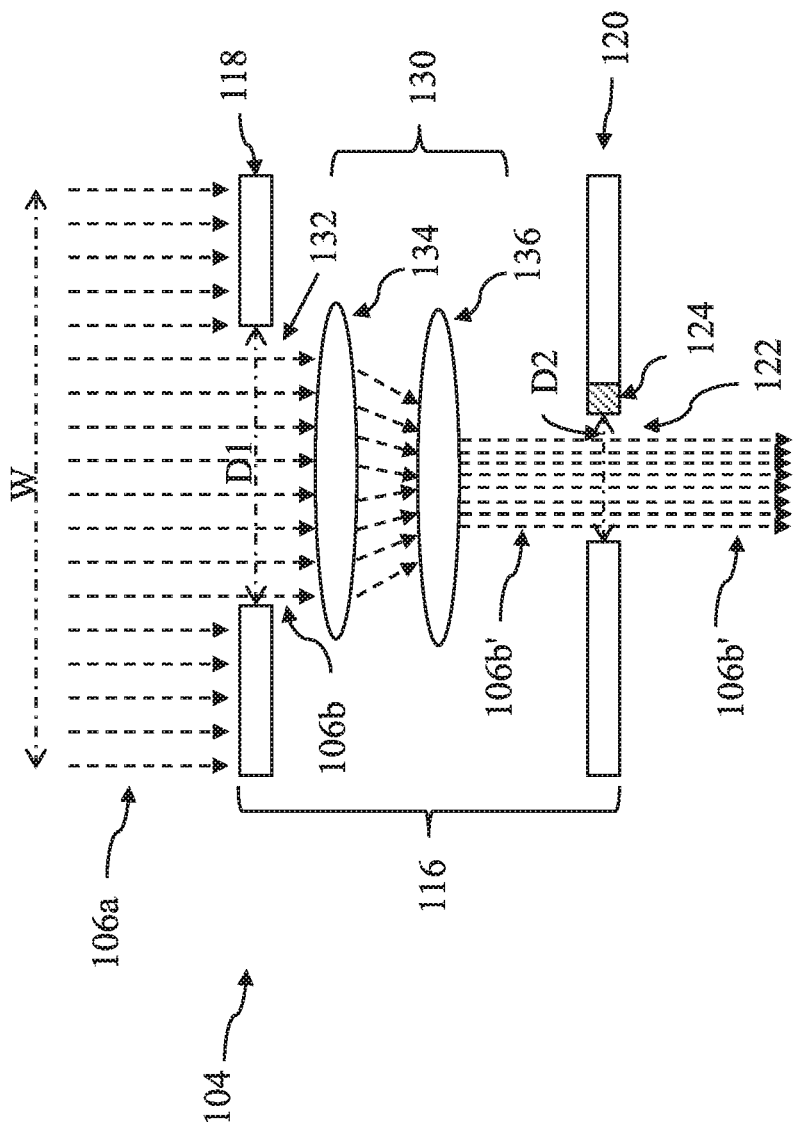
FIG. 2 illustrates some components of the CPMB lithography system of FIG. 1, according to various aspects of the present disclosure.

FIG. 2 illustrates some components of the CPMB lithography system 100 according to various aspects of the present disclosure. Specifically, FIG. 2 illustrates an embodiment of an electro-optical path 116 constructed according to aspects of the present disclosure. FIG. 2 further illustrates a portion of the beam 106a passing through the path 116. In the embodiment as shown, the path 116 includes a plate 118 that is irradiated by the wide and substantially telecentric beam 106a generated by the illumination system 102 (FIG. 1). The plate 118 includes an aperture 132. Portions of the beam 106a pass through the aperture 132, becoming a beamlet 106b. The other portions of the beam 106a that are blocked by the plate 118 are discarded (not used for lithographic exposure). The plate 118 has a sufficient thickness to allow for dissipating the thermal load caused by the impingent particle beam 106a. From a top view (in the direction of the beam 106a), the plate 118 may be round, square, or of any other suitable shape while the aperture 132 may be of the same or different shape. Furthermore, from the top view, the plate 118 has a dimension W and the aperture 132 has a dimension D1, wherein the dimensions W and D1 may be, e.g., a diameter for a round shape or a side width for a square shape. In the present disclosure, a particle beam efficiency, E, is defined as a ratio of the opening area of the aperture 132 to the overall surface area of the plate 118 from the top view, which is directly proportional to $(D1/W)^2$. One design goal of the CPMB lithography system 100 is to increase the particle beam efficiency E.

Still referring to FIG. 2, the path 116 further includes a blanker 120 which can be controlled to switch the path 116 on or off. In the embodiment as shown, the blanker 120 includes a plate with an aperture 122 through which a beamlet may pass. The blanker 120 further includes a blanking element 124 (also referred to as a switching element or a deflecting element). In an embodiment, the blanking element 124 is a controllable charged particle lens, such as an electrode that can be electrically charged or discharged. To further this embodiment, when the blanking element 124 is discharged or not charged, the beamlet 106b travels along a desired path to reach a target, such as the resist film 112 of FIG. 1; when the blanking element 124 is charged, the beamlet 106b is deflected off the desired path and does not reach the target. The blanker 120, including the blanking element 124 and the associated control circuitry, can be made of semiconductor materials in some embodiments. Furthermore, the blanker 120 may include a single plate or multiple plates.

The aperture 122 has a dimension D2. In an embodiment, the apertures 122 and 132 are of the same shape. In an embodiment, both the apertures 122 and 132 are round-shaped. In various embodiments, the dimension D2 is designed to be as small as practicable because it is directly proportional to the pixel size of the pattern to be exposed. Furthermore, when the aperture 122 is smaller, a lower voltage is needed to switch off the path 116. However, a few factors limit the lower bound of the size of the aperture 122 in a practical blanker design. One factor is the target exposure time which is inversely proportional to a current density produced by the beamlets irradiating the target. The current density, in turn, is determined by the amount of the current that passes through the aperture 122, which is directly proportional to the area thereof. Therefore, a smaller aperture 122 will typically result in a longer exposure time. Another factor is the charged particle requirements of the blanker 120. Since the blanker 120 generally includes delicate control circuitry, it is desirable to let the beamlets pass through the central part of the aperture 122 without irradiating the other parts of the blanker 120. Otherwise, highly energized beamlets might affect the functionality of the blanker 120 and/or might reduce its usable lifetime. Furthermore, charged particles close to the rim of the aperture 122 suffer from aberrations such that they cannot be blanked properly. Therefore, it is desirable to have the aperture 122 wider than the footprint of beamlets passing there through. In a typical electro-optical column design, this is achieved by making one or more apertures in front of the aperture 122 (in the direction of the beams 106a/106b), such as the aperture 132, to be smaller than the aperture 122. However, such design adversely reduces the particle beam efficiency E. The present disclosure provides solutions to this problem.

With continued reference to FIG. 2, in the embodiment as shown, the path 116 further includes two electro-optical lenses (or charged particle lenses) 134 and 136 that are axially aligned to form an electro-optical doublet 130. The doublet 130 receives the substantially telecentric beamlet 106b and produces a demagnified beamlet 106b' which is condensed (having a smaller footprint than the beamlet 106b) yet still substantially telecentric. The demagnified beamlet 106b' passes through the central part of the aperture 122, fulfilling the charged particle requirement of the blanker 120. In the embodiment as shown, the electro-optical lens 134 is placed in front of the electro-optical lens 136 in the direction of the beamlet 106b. To further this embodiment, the electro-optical lens 134 focuses the beamlet 106b, and the electro-optical lens 136 collimates the focused beamlet, thereby producing the demagnified beamlet 106b'. In an embodiment, the electro-optical lenses 134 and 136 are both positive (converging) charged particle lenses. In another embodiment, the electro-optical lens 134 is a positive (converging) charged particle lens and the electro-optical lens 136 is a negative (diverging) charged particle lens. In the present embodiment, due to the demagnification factor of the doublet 130, the dimension D1 of the aperture 132 can be configured greater than the dimension D2 of the aperture 122, while still fulfilling the charged particle requirement of the blanker 120. This advantageously increases the particle beam efficiency E. This also advantageously increases the throughput of the CPMB lithography system 100 (FIG. 1) because the beamlet 106b' has higher current density than the beamlet 106b. In an embodiment, the dimension D2 ranges from about 5 to about 10 microns and the dimension D1 ranges from about 10 to about 100 microns, such as from about 20 to about 30 microns. To further this embodiment, the particle beam efficiency E can be increased by about 10 times or more.

Figure 3:
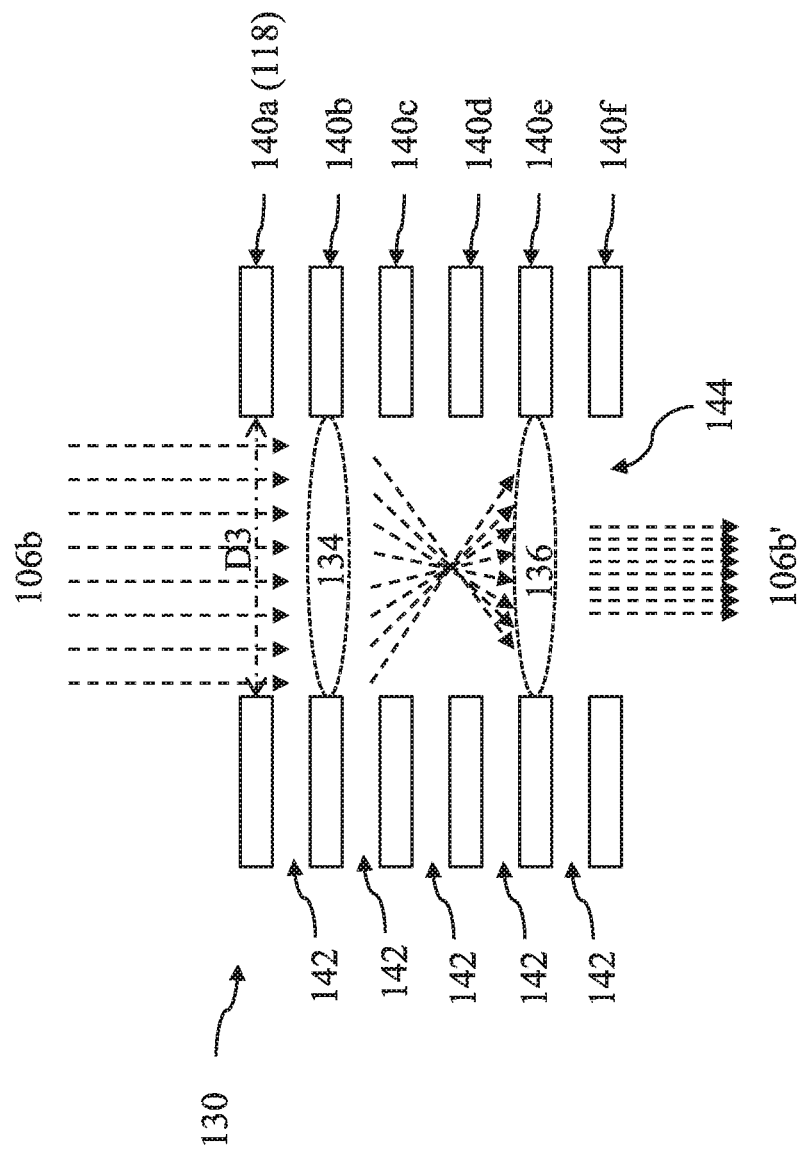
FIG. 3 illustrates an embodiment of a charged particle doublet constructed according to the present disclosure.

FIG. 3 illustrates an embodiment of the doublet 130 constructed according to various aspects of the present disclosure. Referring to FIG. 3, in the present embodiment, the doublet 130 includes six plates, 140a-f, stacked one over the other with a space 142 between every two adjacent plates. The first plate 140a can be merged with or combined into the plate 118 (FIG. 2) in some embodiments. The six plates 140a-f each have a through hole or aperture 144 that are axially aligned so as to pass a beamlet 106b incident thereupon. In various embodiments, the aperture 144 has a dimension D3 ranging from about 10 to about 100 microns, such as from about 20 to about 30 microns. In the embodiment as shown, the apertures 144 have the same dimension as the aperture 132 (FIG. 2). In alternative embodiments, the apertures 144 and 132 may have different dimensions. In an embodiment, the six plates 140a-f are identical in shape, size, and material. As an example, the six plates 140a-f each are square-shaped, have a thickness ranging from about 10 to about 100 microns, and have a side length ranging from about 10 to about 100 millimeters. In another embodiment, each of the six plates 140a-f is a parallelogram. In an embodiment, each of the six plates 140a-f is made of a conductive material, such as copper or aluminum. In an embodiment, the space 142 has a dimension ranging from about 100 to about 1,000 microns when measured in the direction of the beamlet 106b. In an embodiment, the spaces 142 (excluding the areas for the apertures 144) are filled with an electrically insulating material, such as ceramic or silicon oxide. With its durability, strength, and manufacturability, ceramic is very suitable for insulating the plates 140a-f. One method of making the doublet 130 is to stack six square-shaped metal plates with an insulating material there between and then to drill a through-hole to form the apertures 144. Other methods are available from semiconductor assembly processes.

Still referring to FIG. 3, in an embodiment, the plates 140a-c are configured to form the charged particle lens 134, while the plates 140d-f are configured to form the charged particle lens 136, wherein both the charged particle lenses 134 and 136 are converging lens. To further this embodiment, the plates 140a-f are conductive plates and each are applied with an appropriate voltage based on the energy level of the beamlet 106b. In one exemplary configuration where the aperture 144 is about 20 to 30 microns and the beamlet 106b has a kinetic energy about 5 keV, the plates 140a, 140c, 140d, and 140f are each grounded (0 V), the plate 140b is applied with a +4 kV voltage, and the plate 140e is applied with a −4 kV voltage. In such a configuration, the doublet 130 produces a demagnified beamlet 106b' that has a kinetic energy about 5 keV and has a footprint sufficiently small for passing through the aperture 122 (about 5 to 10 microns) of the blanker 120 (FIG. 2).

Although FIG. 3 shows the doublet 130 having six plates, in various embodiments, configurations using different number of plates are possible. For example, the doublet 130 can be made of five plates with the two charged particle lenses 134 and 136 sharing a ground plate. As another example, the doublet 130 can be made of four plates where the two charged particle lenses 134 and 136 are each formed out of two plates. Furthermore, in various embodiments, the plates 140a-f may be made of the same or different materials and may be of the same or different size or shape; the aperture 144 in each of the plates 140a-f may be of the same or different size and/or shape; and the space 142 between adjacent plates may be of the same or different dimensions. In addition, in some embodiments, structures other than plates can be used to form the doublet 130.

Figure 4A:
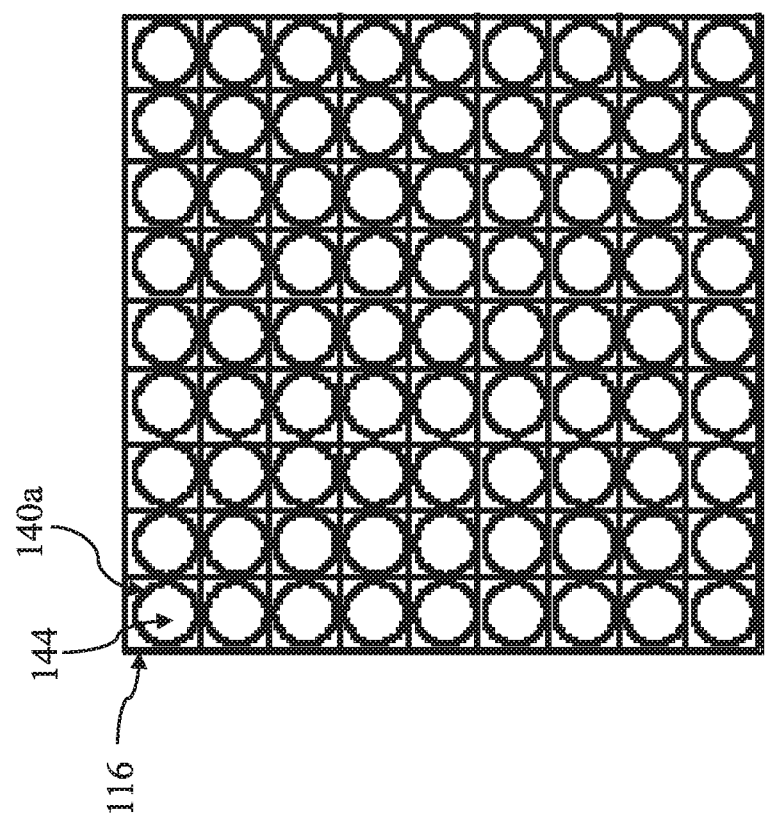
FIGS. 4A and 4B illustrate top views of embodiments of electro-optical paths constructed according to the present disclosure.

FIG. 4A illustrates a top view of a configuration of the electro-optical paths 116 in the electro-optical column 104 (FIG. 1), according to an embodiment of the present disclosure. In the embodiment as shown, each path 116 includes a square-shaped top plate 140a and a round-shaped first aperture 144. The paths 116 are arranged in a 9×9 square grid. In an embodiment, the paths 116 are formed by stacking a plurality of plates one over another and drilling holes 144 through the stacked plates. To further this embodiment, the paths 116 share the plurality of plates.

Figure 4B:
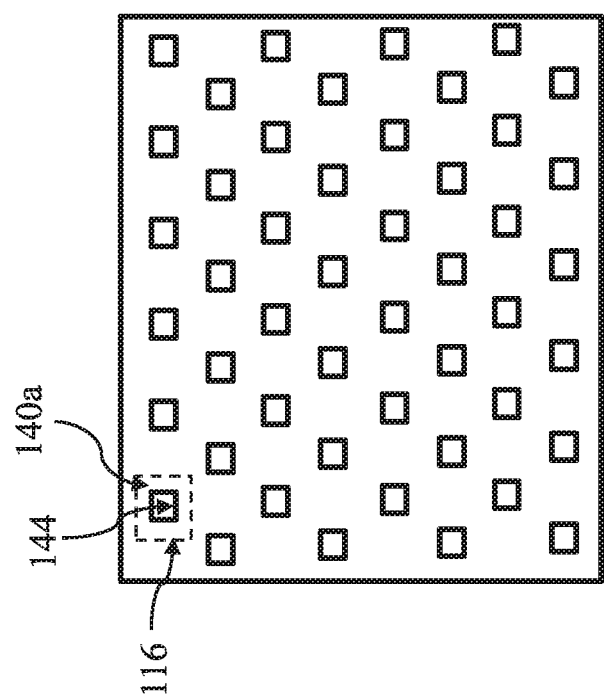

FIG. 4B illustrates a top view of another configuration of the electro-optical paths 116 in the electro-optical column 104 (FIG. 1), according to an embodiment of the present disclosure. In the embodiment as shown, each path 116 has a square-shaped top plate 140a and a square-shaped first aperture 144. Furthermore, the paths 116 are arranged in a 6×8 checker board. The configurations of paths 116 as shown in FIGS. 4A and 4B are examples and other configurations are possible.

Although not intended to be limiting, one or more embodiments of the present disclosure provide many benefits to a charged particle multi-beam (CPMB) lithography system. One benefit is that an electro-optical column or a pattern definition system constructed according to the present disclosure provides high particle beam efficiency. With charged particle doublets at its front portion, the electro-optical column allows for more charged particles to pass through, even with a narrow aperture in its blanker portion. This may advantageously shorten the target exposure time for the CPMB lithography system, thereby increasing its throughput. This may also advantageously reduce the energy level requirement of the illumination system, leading to a less expensive CPMB lithography system. Another benefit is that various embodiments of the present disclosure can be manufactured with existing semiconductor assembly processes and can be used to replace various components in existing CPMB lithography systems.

In one exemplary aspect, the present disclosure is directed to an apparatus for use in a charged particle multi-beam lithography system. The apparatus includes a plurality of charged particle doublets each having a first aperture and each configured to demagnify a beamlet incident upon the first aperture thereby producing a demagnified beamlet. In an embodiment, the apparatus further includes a plurality of charged particle lenses each having a second aperture, each associated with one of the charged particle doublets, and each configured to receive the demagnified beamlet from the associated charged particle doublet and to realize one of two states: a switched-on state, wherein the demagnified beamlet is allowed to travel along a desired path, and a switched-off state, wherein the demagnified beamlet is prevented from traveling along the desired path.

In another exemplary aspect, the present disclosure is directed to an apparatus for use in a charged particle multi-beam lithography system. The apparatus includes a charged particle doublet having a first aperture and configured to pass and demagnify a beamlet incident thereupon and a charged particle lens having a second aperture that is axially aligned with the first aperture, wherein the charged particle lens is configured to realize a switched-on state, wherein the demagnified beamlet is allowed to travel along a desired path, and a switched-off state, wherein the demagnified beamlet is prevented from traveling along the desired path.

In yet another exemplary aspect, the present disclosure is directed to a charged particle multi-beam (CPMB) lithography system. The CPMB lithography system includes an illumination system that is configured to generate a first charged particle beam that is substantially telecentric, and an electro-optical column that includes a plurality of doublets. Each of the doublets includes a first aperture and is configured to demagnify a portion of the first charged particle beam passing through the first aperture, thereby producing a demagnified beamlet that is also substantially telecentric. The electro-optical column further includes a plurality of blankers each associated with one of the doublets. Each of the blankers includes a second aperture, is configured to receive the demagnified beamlet from the associated doublet, and is configured to realize one of two states: a switched-on state, wherein the demagnified beamlet is allowed to travel along a desired path, and a switched-off state, wherein the demagnified beamlet is prevented from traveling along the desired path.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A charged particle multi-beam lithography system, the system comprising:
an illumination sub-system that is configured to generate a charged particle beam;
multiple plates with a first aperture through the plates, wherein the plates and the first aperture are configured to form a charged particle doublet; and
a blanker having a second aperture whose footprint is smaller than that of the first aperture,
wherein the charged particle doublet is configured to demagnify a portion of the charged particle beam passing through the first aperture, thereby producing a demagnified beamlet; and wherein the blanker is configured to receive the demagnified beamlet, and is further configured to conditionally allow the demagnified beamlet to travel along a desired path.

2. The system of claim 1, wherein the plates are conductive and are stacked one over another with an insulating material between adjacent plates.

3. The system of claim 2, wherein the plates are spaced away by a distance ranging from about 100 to 1,000 microns, and each of the plates has a thickness ranging from about 10 to 100 microns.

4. The system of claim 2, wherein the insulating material is ceramic or silicon oxide.

5. The system of claim 2, wherein the plates include copper or aluminum.

6. The system of claim 1, wherein two of the plates are configured to opposite voltages and at least one of the other plates is grounded.

7. The system of claim 1, wherein the plates are square-shaped and the first aperture is square-shaped.

8. The system of claim 1, wherein the plates are square-shaped and the first aperture is round-shaped.

9. The system of claim 1, wherein the plates have a plurality of apertures therethrough including the first aperture, and each of the plurality of apertures is configured to form a respective charged particle doublet.

10. The system of claim 9, wherein the plurality of apertures are arranged in a square grid configuration, a checker board configuration, or a honeycomb configuration.

11. The system of claim 1, wherein the first and second apertures are of different shapes.

12. An apparatus for use in a charged particle multi-beam lithography system, comprising:
a stage for securing a substrate and supporting relative movement between the substrate and an output from a radiation source;
the radiation source for producing a beam;
charged particle doublets, each of the charged particle doublets configured to demagnify a portion of the beam incident thereupon, thereby producing a demagnified beamlet; and
charged particle lenses, each of the charged particle lenses being associated with one of the charged particle doublets, and configured to receive the demagnified beamlet and to realize one of two states: a switched-on state, wherein the demagnified beamlet is allowed to travel along a desired path toward the stage, and a switched-off state, wherein the demagnified beamlet is prevented from traveling along the desired path.

13. The apparatus of claim 12, wherein each of the charged particle doublets has a first aperture through which the portion of the beam passes, each of the charged particle lenses has a second aperture through which the demagnified beamlet conditionally passes, and the first aperture has a larger footprint than the second aperture.

14. The apparatus of claim 12, wherein each of the charged particle doublets includes a converging charged particle lens and a diverging charged particle lens that are axially aligned.

15. The apparatus of claim 12, wherein the charged particle doublets comprise conductive plates stacked one over another with an insulating material between adjacent conductive plates.

16. The apparatus of claim 15, wherein each of the charged particle doublets includes two lenses, and one of the conductive plates is a ground plate shared between the two lenses.

17. An apparatus for use in a charged particle multi-beam lithography system, comprising:
a stage for securing a substrate and supporting relative movement between the substrate and an output from a radiation source;
the radiation source for producing a beam;
a first charged particle means for demagnifying a portion of the beam incident thereupon, thereby producing a demagnified beamlet to be directed at the stage; and
a second charged particle means for receiving the demagnified beamlet and configured to conditionally allow the demagnified beamlet to travel along a desired path.

18. The apparatus of claim 17, wherein the first charged particle means includes two converging charged particle lenses axially aligned and providing a first aperture through which the portion of the beam passes.

19. The apparatus of claim 18, wherein the second charged particle means includes a blanker that provides a second aperture through which the demagnified beamlet travels, wherein the second aperture has a smaller footprint than the first aperture.

20. The apparatus of claim 17, wherein the first charged particle means includes at least four conductive plates stacked one over another with an insulating material between adjacent conductive plates.

* * * * *